(12) United States Patent
Lee et al.

(10) Patent No.: US 6,461,952 B2
(45) Date of Patent: Oct. 8, 2002

(54) METHOD FOR GROWING BARIUM TITANATE THIN FILM

(75) Inventors: Ming-Kwei Lee; Hsin-Chih Liao, both of Kaohsiung (TW)

(73) Assignee: National Science Council (TW)

( * ) Notice: Subject to any disclaimer, the term of this patent is extended or adjusted under 35 U.S.C. 154(b) by 0 days.

(21) Appl. No.: 09/733,457

(22) Filed: Dec. 8, 2000

(65) Prior Publication Data

US 2001/0004547 A1 Jun. 21, 2001

(30) Foreign Application Priority Data

Dec. 10, 1999 (TW) ........................................ 088121714

(51) Int. Cl.$^7$ ......................................... H01L 21/3205
(52) U.S. Cl. ........................ 438/603; 438/3; 438/240; 438/602; 257/295; 423/598
(58) Field of Search .................. 438/3, 240, 602, 438/603; 257/295, 310; 427/62, 126.3; 423/598

(56) References Cited

U.S. PATENT DOCUMENTS

| | | | |
|---|---|---|---|
| 4,587,041 A | * | 5/1986 | Uedaira et al. .............. 252/572 |
| 5,009,876 A | * | 4/1991 | Hennings et al. ............ 423/598 |
| 5,328,718 A | * | 7/1994 | Abe et al. ................. 427/126.3 |
| 5,451,426 A | * | 9/1995 | Abe et al. ................. 427/126.3 |
| 5,824,278 A | * | 10/1998 | Yao ............................. 423/263 |
| 6,066,359 A | * | 5/2000 | Yao et al. ................. 427/126.3 |
| 6,352,681 B1 | * | 4/2002 | Horikawa et al. ........... 423/598 |

FOREIGN PATENT DOCUMENTS

JP        05 85728        * 5/1993 .................. 423/598

OTHER PUBLICATIONS

Abe et al., JP 05 85728, Translation.*

* cited by examiner

Primary Examiner—Carl Whitehead, Jr.
Assistant Examiner—Maria Guerrero
(74) Attorney, Agent, or Firm—Trojan Law Offices

(57) ABSTRACT

A method for preparing a barium fluorotitanate ($BaTiF_6$) powder and depositing a barium titanate ($BaTiO_3$) thin film on a silicon wafer is disclosed. The method includes steps of a) producing a barium fluorotitanate powder by mixing a hexafluorotitanic acid solution and a barium nitrate solution at a low temperature, b) dissolving the barium fluorotitanate powder into water and mixing with a boric acid solution, and c) immersing a silicon wafer into the mixture at a low temperature to grow a barium titanate thin film on the silicon wafer.

18 Claims, 2 Drawing Sheets

METHOD FOR GROWING BARIUM TITANATE THIN FILM

"This application claims priority to Taiwan patent application Ser. No. 088121714, filed Dec. 10, 1999."

FIELD OF THE INVENTION

The present invention relates to a method for preparing a barium fluorotitanate ($BaTiF_6$) powder and barium titanate ($BaTiO_3$), and more particularly to a method for growing a barium titanate thin film on a silicon wafer from the barium fluorotitanate powder at a low temperature.

BACKGROUND OF THE INVENTION

Because of its high dielectric constant, barium titanate (BaTiO3) is widely used in alternative charge storage insulators of semiconductor devices, for example, dynamic random access memories (DRAMs) or microelectromechanic systems (MEMS). In addition, barium titanate can be used to replace silicon dioxide ($SiO_2$) as a gate oxide of metaoxide-silicon field-effect transistor (MOSFET) in the process for manufacturing semiconductors.

The methods for preparing barium titanate are generally divided into two types. One is a dry growing method such as chemical vapor deposition, metal organic chemical vapor deposition (MOCVD), molecular beam epitaxy (MBE), and sputtering. The apparatuses for performing this method are very expensive, and the high working temperature will induce thermal stress to the apparatuses and degenerate the gate oxide. The other is a wet growing method such as sol-gel process and liquid phase deposition (LPD). However, a sintering process at high temperature from about 600° C. to 1000° C. is necessary to prepare barium titanate by the sol-gel method. Thus, the defects resulted from the high temperature process could not be avoided.

In order to solve the above problems, the present invention provides a method for growing a barium titanate thin film at a low temperature and stabilizing the materials. In addition, the present invention also provides a method for increasing the precision of the process effectively.

SUMMARY OF THE INVENTION

It is therefore an object of the present invention to provide a method for preparing a barium fluorotitanate ($BaTiF_6$) powder.

In accordance with the present invention, the method for preparing the barium fluorotitanate ($BaTiF_6$) powder includes steps of a) mixing a hexafluorotitanic acid ($H_2TiF_6$) solution and a barium nitrate ($Ba(NO_3)_2$) solution at a specific temperature to produce the barium fluorotitanate precipitate and b) isolating and drying the barium fluorotitanate precipitate powder.

Preferably, the specific temperature is in the range of 0° C. to 100° C.

Preferably, the concentration of the hexafluorotitanic acid solution is in the range of 0.01 M to 6.10 M. The concentration of the barium nitrate solution is in the range of 0.01 M to 0.30 M.

The volume ratio of the hexafluorotitanic acid solution to the barium nitrate solution is any value but preferably between 10:1 and 10:6.

More specially, the barium fluorotitanate is iosolated by heating.

It is another object of the present invention to provide a method for growing a barium titanate ($BaTiO_3$) thin film on a silicon wafer.

In accordance with the present invention, the method for growing the barium titanate thin film on the silicon wafer includes steps of a) dissolving a barium fluorotitanate powder in water to form a barium fluorotitanate solution, b) introducing a boric acid ($H_3BO_3$) solution to the barium fluorotitanate solution to form a mixture, and c) immersing a silicon wafer to the mixture at a specific temperature to grow a barium titanate thin film on the silicon wafer.

Preferably, the specific temperature is in the range of 0° C. to 100° C.

Preferably, the concentration of the barium fluorotitanate solution is in the range of 0.01 M to 0.06 M. The concentration of the boric acid solution is in the range of 0.01 M to 0.95 M.

Preferrably, the water used in the step (a) is deionized water.

Certainly, the barium titanate thin film can be deposited on the customarily used silicon substrate or other substrates.

It is still an object of the present invention to provide a method for growing a barium titanate thin film on a silicon wafer.

The method for growing a barium titanate thin film on a silicon wafer includes steps of a) mixing a hexafluorotitanic acid ($H_2TiF_6$) solution and a barium nitrate ($Ba(NO_3)_2$) solution at a specific temperature to produce a barium fluorotitanate ($BaTiF_6$) powder, b) dissolving the barium fluorotitanate powder in water and introducing a boric acid ($H_3BO_3$) solution to form a mixture and c) immersing a silicon wafer to the mixture at a specific temperature to grow a barium titanate thin film on the silicon wafer.

Preferably, the specific temperature is in the range of 0° C. to 100° C.

Preferably, the concentration of the hexafluorotitanic acid solution is in the range of 0.01 M to 6.10 M.

In accordance with another aspect of the present invention, the concentration of the barium nitrate solution is in the range of 0.01 M to 0.30 M.

Preferably, the volume ratio of the hexafluorotitanic acid solution to the barium nitrate solution is preferably between 10:1 and 10:6.

Preferably, the concentration of the boric acid solution is in the range of 0.01 M to 0.95 M.

Certainly, the barium titanate can also be deposited on any other materials as on silicon.

The present invention may best be understood through the following descriptions and the accompanying drawings, in which:

DETAILED DESCRIPTION OF THE PREFERRED EMBODIMENTS

The present invention point out that a barium nitrate ($Ba(NO_3)_2$) solution and a hexafluorotitanic acid ($H_2TiF_6$)

solution are mixed to produce a white crystal powder. The white crystal powder is identified as barium fluorotitanate (BaTiF$_6$) by an x-ray powder identification. The equation of the chemical reaction is shown as follows:

$$H_2TiF_6 + Ba(NO_3)_2 \leftrightarrow BaTiF_6 + 2HNO_3 \quad (1)$$

As shown in equation (1), the hexafluorotitanic acid solution is reacted with the barium nitrate solution to produce the barium fluorotitanate powder.

Then, the barium fluorotitanate powder is dried and some water is added to produce a barium titanate (BaTiO$_3$) thin film. The chemical reactions are shown as the following equations:

$$BaTiF_6 + 3H_2O \leftrightarrow BaTiO_3 + 6HF \quad (2)$$

$$H_3BO_3 + 4HF \leftrightarrow BF_4^- + H_3O^+ + 2H_2O \quad (3)$$

As shown in equation (2), the barium fluorotitanate solution reacts with water to produce a barium titanate solution, and then a boric acid solution is added to react with a hydrofluoric acid solution such that the reaction of the equation (2) is driven from left to right. Thus, a barium titanate thin film is produced.

Figure 1:
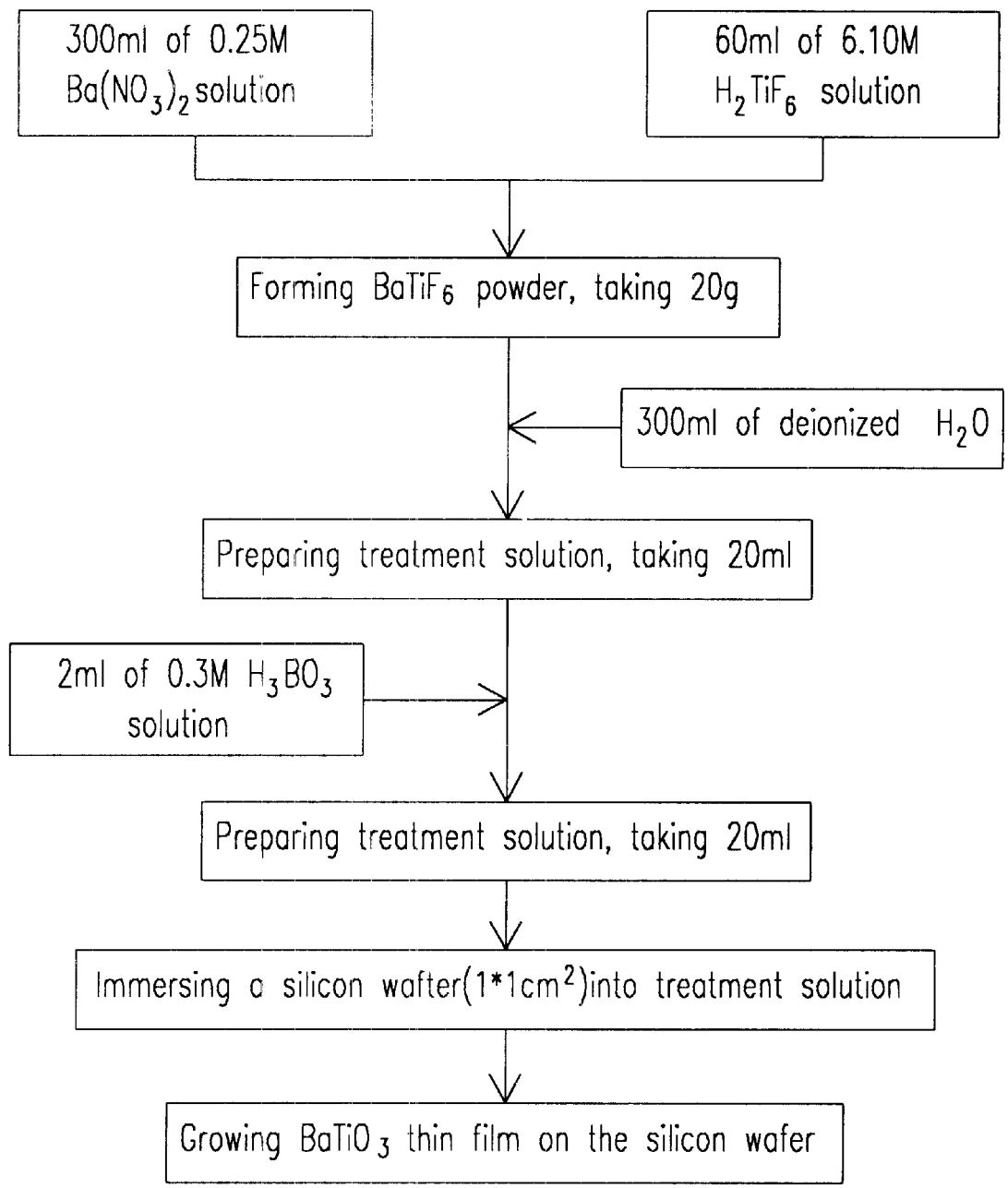
FIG. 1 is a flow chart illustrating the method for growing a barium titanate thin film on a silicon wafer according to the preferred embodiment of the present invention.

FIG. 1 is a flow chart illustrating the method for growing a barium titanate thin film on a silicon wafer according to the preferred embodiment of the present invention. A 60 ml of 6.10 M H$_2$TiF$_6$ solution and a 300 ml of 0.25 M Ba(NO$_3$)$_2$ solution are mixed directly, and then a white BaTiF$_6$ powder is clearly precipitated. Subsequently, the white BaTiF$_6$ powder is dried by heating. A 20 g of the powder is dissolved in a 300 ml of deionized water by agitation to form a solution, and then 20 ml of the solution is introduced into a Teflon vessel. Then adding 2 ml of 0.30 M H$_3$BO$_3$ solution into the Teflon vessel to form a mixture as a treatment solution. A Clean silicon wafer is immersed into the Teflon vessel containing the treatment solution, and then the Teflon vessel is put in a temperature-controlled container to grow a barium titanate thin film on the silicon wafer by liquid phase deposition (LPD) at a specific temperature. The preferable temperature is in the range of 0° C. to 100° C. in the present invention. After a period of time, the silicon wafer grown with the barium titanate thin film is taken out of the incubator.

In accordance with the present invention, the barium fluorotitanate powder can be stored without changing its composition. The concentration of the hexafluorotitanic acid solution may be changed during the period of storage. In addition, the concentration of the hexafluorotitanic acid solution may be varied with the uncertainty from the original preparation, which usually influences the reproducible quality of the manufacturing process. However, the barium fluorotitanate powder used in the present invention is very stable so as to ease the complexity and increase the reproducible quality of the manufacturing process. Furthermore, the efficiency and convenience of the manufacturing process are both improved. Thus, the present invention is more beneficial to grow a barium titanate thin film.

Figure 2:
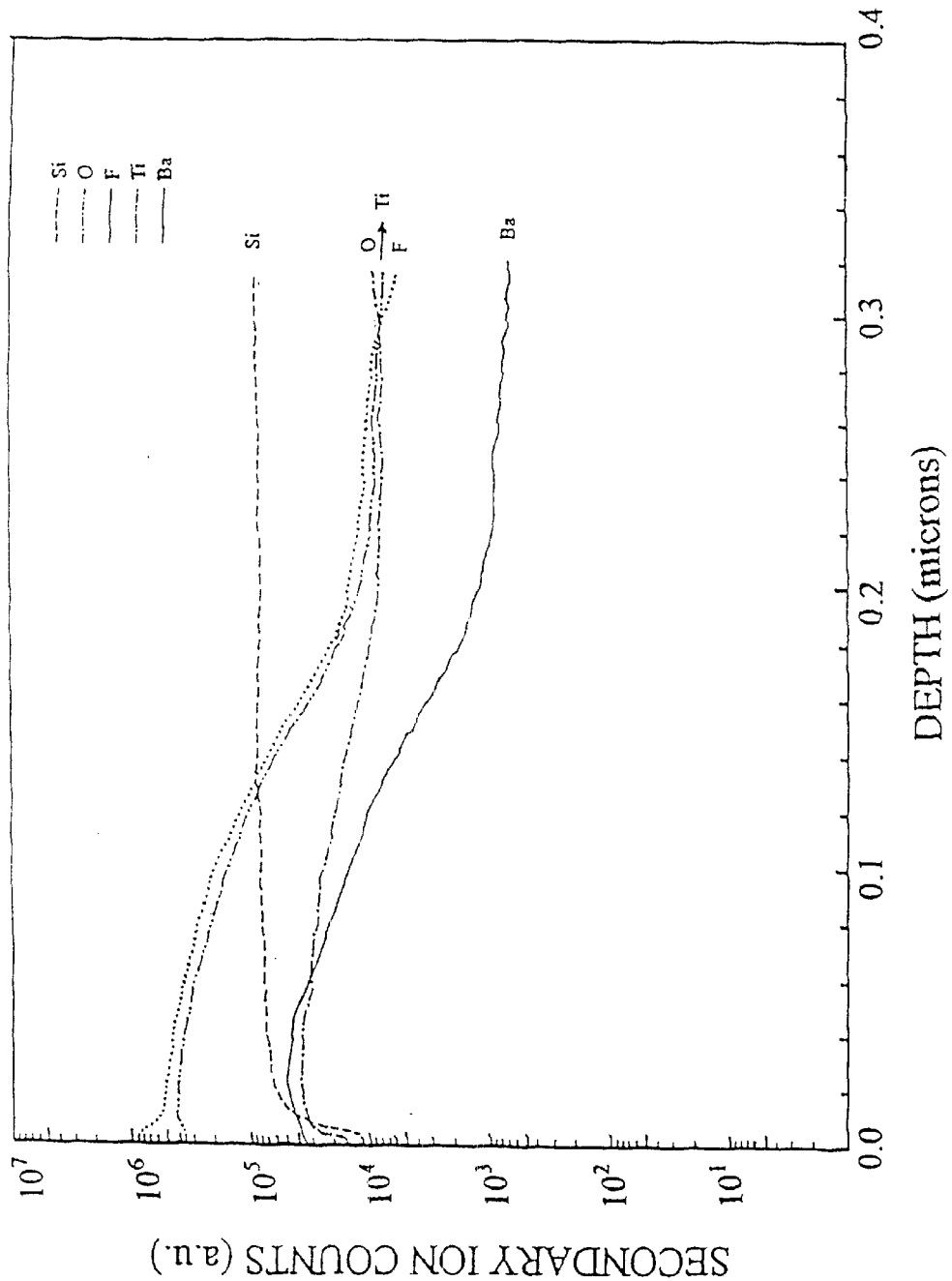
FIG. 2 is a diagram showing the secondary ion counts of the barium titanate thin film for the preferred embodiment of the present invention analyzed by SIMS.

Because the barium fluorotitanate powder is used as the material of treatment solution, the ratio of Ba/Ti is precisely controlled. As shown in FIG. 2, the barium titanate thin film in the present invention is identified by a secondary ion mass spectroscopy (SIMS). Referring to FIG. 2, the Ba/Ti ratio is almost constant for facilitating the preparation of the barium titanate thin film by liquid phase deposition.

The barium titanate thin film prepared by the present invention has better characteristics, for example, the index of refraction (n) can reach 1.7, the dielectric constant (k) can reach 50, the electrode area is 7.07×10$^{-4}$ cm$^2$, the thickness of the thin film is 1440 angstrom, the growing rate is 23 angstrom/min, and the leakage current density reaches 4.1× 10$^{-5}$ ampere/cm$^2$ under 40 volts DC bias. Thus, the barium titanate thin film prepared according to the present invention can be successfully used in semiconductor industry.

The present invention provides a method not only to ease the manufacturing process but remove the defects of storage. In addition, the present invention provides a method to increase the stability of the barium titanate thin film. Moreover, the method of the present invention can be performed without using expensive devices, thereby the production costs are greatly decreased.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A method for growing a barium titanate (BaTiO$_3$) film on a silicon wafer comprising steps of:
   d) providing a barium fluorotitanate (BaTiF$_6$) powder and dissolving said barium fluorotitanate (BaTiF$_6$) powder in water;
   e) adding a boric acid (H$_3$BO$_3$) solution to form a mixture; and
   f) immersing said silicon wafer in said mixture at a specific temperature to grow said barium titanate (BaTiO$_3$) film on said silicon wafer.

2. The method according to claim 1 wherein said specific temperature is in the range of 0° C. to 100° C.

3. The method according to claim 1 wherein the concentration of said barium fluorotitanate (BaTiF$_6$) solution is in the range of 0.01 M to 0.06 M.

4. The method according to claim 1 wherein the concentration of said boric acid (H$_3$BO$_3$) solution is in the range of 0.01 M to 0.95 M.

5. The method according to claim 1 wherein said barium titanate (BaTiO$_3$) is grown on a silicon substrate of said silicon wafer.

6. A method for preparing a barium fluorotitanate (BaTiF$_6$) powder comprising steps of:
   a) mixing a hexafluorotitanic acid (H$_2$TiF$_6$) solution and a barium nitrate (Ba(NO$_3$)$_2$) solution at a specific temperature to produce barium fluorotitanate (BaTiF$_6$) powder; and
   b) drying said barium fluorotitanate (BaTiF$_6$) powder.

7. The method according to claim 6 wherein said specific temperature is in the range of 0° C. to 100° C.

8. The method according to claim 6 wherein the concentration of said hexafluorotitanic acid (H$_2$TiF$_6$) solution is in range of 0.01 M to 6.10 M.

9. The method according to claim 6 wherein the concentration of said barium nitrate (Ba(NO$_3$)$_2$) solution is in the range of 0.01 M to 0.30 M.

10. The method according to claim 6 wherein the volume ratio of said hexafluorotitanic acid (H$_2$TiF$_6$) to said barium nitrate (Ba(NO$_3$)$_2$) is between 10:1 and 10:6.

11. The method according to claim 6 wherein barium fluorotitanate (BaTiF$_6$) precipitation is dried by heating.

12. A method for growing a barium titanate ($BaTiO_3$) film on a silicon wafer comprising steps of:
   a) providing a barium fluorotitanate ($BaTiF_6$) powder, wherein said barium fluorotitanate ($BaTiF_6$) powder is formed by mixing a hexafluorotitanic acid ($H_2TiF_6$) solution and a barium nitrate ($Ba(NO_3)_2$) solution at a first specific temperature;
   b) dissolving said barium fluorotitanate ($BaTiF_6$) powder in water and adding a boric acid ($H_3BO_3$) solution to form a mixture; and
   c) immersing said silicon wafer in said mixture at a second specific temperature to grow said barium titanate ($BaTiO_3$) film on said silicon wafer.

13. The method according to claim 12 wherein said first specific temperature in step a) is in the range of 0° C. to 100° C.

14. The method according to claim 12 wherein the concentration of said hexafluorotitanic acid ($H_2TiF_6$) solution is in the range of 0.01 M to 6.10 M.

15. The method according to claim 12 wherein the concentration of said barium nitrate ($Ba(NO_3)_2$) solution is in the range of 0.01 M to 0.30 M.

16. The method according to claim 12 wherein the volume ratio of said hexafluorotitanic acid ($H_2TiF_6$) solution to said barium nitrate ($Ba(NO_3)_2$) solution is between 10:1 and 10:6.

17. The method according to claim 12 wherein said second specific temperature in step c) is in the range of 0° C. to 100° C.

18. The method according to claim 12 wherein the concentration of said boric acid ($H_3BO_3$) solution is in the range of 0.01 M to 0.95 M.

* * * * *